(12) United States Patent
Menda

(10) Patent No.: US 7,250,721 B2
(45) Date of Patent: Jul. 31, 2007

(54) ORGANIC EL ELEMENT AND ORGANIC EL DISPLAY PANEL

(75) Inventor: Michio Menda, Yonezawa (JP)

(73) Assignee: Tohoku Pioneer Corporation, Tendo-shi, Yamagata (JP)

( * ) Notice: Subject to any disclaimer, the term of this patent is extended or adjusted under 35 U.S.C. 154(b) by 230 days.

(21) Appl. No.: 11/152,105

(22) Filed: Jun. 15, 2005

(65) Prior Publication Data
US 2005/0285521 A1    Dec. 29, 2005

(30) Foreign Application Priority Data
Jun. 17, 2004    (JP)    ............... 2004-180232

(51) Int. Cl.
*H01J 1/62*    (2006.01)
(52) U.S. Cl. ...................... 313/506; 313/504
(58) Field of Classification Search .............. 313/498, 313/504, 506, 509, 512
See application file for complete search history.

(56) References Cited

FOREIGN PATENT DOCUMENTS
JP    10-312883    11/1998

*Primary Examiner*—Vip Patel
(74) *Attorney, Agent, or Firm*—Westerman, Hattori, Daniels & Adrian, LLP.

(57) ABSTRACT

An organic EL element which has a good element property and can realize high productivity is provided. The organic EL element 100 is provided with an element substrate 120 for forming an organic layer including at least a light emitting layer 105 between a pair of opposing electrodes which are provided on the substrate, in which a surface of the above-mentioned element substrate is covered with a sealing layer 110, wherein the above-mentioned sealing layer 110 includes a self-recovery layer 113 which causes volume change in a predetermined environment.

14 Claims, 2 Drawing Sheets

ORGANIC EL ELEMENT AND ORGANIC EL DISPLAY PANEL

BACKGROUND OF THE INVENTION

1. Field of the Invention

The present invention relates to an organic EL element and an organic EL display panel.

2. Description of the Related Art

Since a display apparatus, a light emitting element, etc. of a variety of information industrial apparatuses have been thinned and also have good visibility, impact resistance, etc., use of an organic electroluminescence element (hereinafter referred to as an organic EL element) is spreading. The organic EL element has a structure in which an organic layer sandwiched between a pair of electrodes is formed on a substrate. The organic layer is constructed such that a plurality of layers having different functions are stacked and constructed to include an electron hole injection layer, an electron hole transporting layer, a light emitting layer, an electron transporting layer, and an electron injection layer, for example.

In the organic EL element, the ingress of degradation factors, such as moisture, oxygen, and various gases, from the outside of the element into the inside causes the organic layer to deteriorate, to thereby generate a non-light emitting region called a dark spot. Thus, the organic EL element is conventionally sealed by means of a sealing can and a sealing substrate. However, if the organic electroluminescence display panel (hereinafter referred to as organic EL display panel) is constituted by the organic EL element sealed by the sealing can or the sealing substrate, a thickness of the panel is a thickness including the sealing substrate, and the increased thickness inhibits it from being thinned.

For example, if the organic EL display panel is constructed such that the organic layer is formed to provide the organic EL element on the substrate and this element is sealed by the sealing substrate, the thickness of the organic layer is as thin as approximately 0.2 mm, which does not influence the thickness of the panel. Therefore, the thickness of the panel is determined by the thickness of the substrate and the sealing substrate. Since the thickness of the substrate and the sealing substrate is approximately 0.7 mm, the thickness of the organic EL display panel of this structure is approximately 1.4 mm. Since the organic EL display panel is required to be thinned, it is necessary to further reduce the thickness of the organic EL display panel.

As a structure which attains the thinning of the organic EL display panel, there is a structure in which the organic EL element is sealed with a sealing film instead of the sealing can and the sealing substrate. For example, when the sealing film with a thickness of approximately 5 mm is formed and the organic EL element is sealed, the thickness of sealing film does not influence the thickness of the organic EL display panel constituted by the organic EL element. Therefore, the thickness of the panel is determined by the thickness of the substrate. Thus, for example, if the thickness of the substrate is approximately 0.7 mm, the thickness of the organic EL display panel is approximately 0.7 mm.

Further, compared with the case where the sealing by means of the sealing canor the sealing substrate, the sealing by means of the sealing film further exhibits the following advantageous effects. In other words, if the organic EL element is sealed by using the sealing can or the sealing substrate, in a top emission type organic EL element which emits light from a side opposite to (that is, a sealing side) the substrate, a light refractive index of the sealing can or the sealing substrate affects the light emission, and the control is difficult. However, if the organic EL element is sealed by the sealing film, it is easy to control the refractive index of the sealing film on the light emitting side. Thus, it is possible to take out the light efficiently.

An example of such an arrangement where the organic EL element is sealed by means of the sealing film is one where the sealing films are constructed to be multi-layered. For example, the sealing film is constituted by two or more layers including a buffer layer for covering irregular portions of the organic EL element, and a barrier layer stacked on this buffer layer (for example, see Japanese Laid-Open Patent No. H10-312883).

Although this sealing film is formed by sputtering etc., the thus formed sealing film is difficult to increase in film thickness. Therefore, it is difficult to form the sealing film without defects, such as a pinhole, so that the degradation factors, such as water, oxygen, and various gases, ingress into the organic EL element from the outside through the defects. Such ingress of the degradation factor from the outside degrades the organic layer which constitutes the organic EL element, to thereby generate a dark spot etc. and degrade the element properties.

Particularly, in the formation of the sealing film by sputtering, since particles may adhere to a surface of the organic EL element together with a sputtering material at the time of film forming, the foreign substance has adhered to the formed sealing film. Further, if this foreign substance is released from the sealing film, a hole, i.e., a pinhole, is formed in the part from which the foreign substance is released. If such a pinhole is formed in the sealing film whose film thickness is thin, the organic EL element is communicated with the outside through the pinhole, so that a degradation factor may ingress into the organic EL element through the pinhole.

SUMMARY OF THE INVENTION

The organic EL element in accordance with the present invention is an organic EL element having an element substrate for forming an organic layer including at least a light emitting layer between a pair of opposing electrodes which are provided on the substrate, in which a surface of the above-mentioned element substrate is covered with a sealing layer, wherein the above-mentioned sealing layer includes a self-recovery layer which causes volume change in a predetermined environment.

The organic EL display panel in accordance with the present invention is an organic EL display panel constituted by an organic EL element having an element substrate for forming an organic layer including at least a light emitting layer between a pair of opposing electrodes which are provided on the substrate, in which a surface of the above-mentioned element substrate is covered with a sealing layer, wherein the above-mentioned sealing layer of the above-mentioned organic EL element includes a self-recovery layer which causes volume change in a predetermined environment.

DESCRIPTION OF THE PREFERRED EMBODIMENTS

Figure 1:
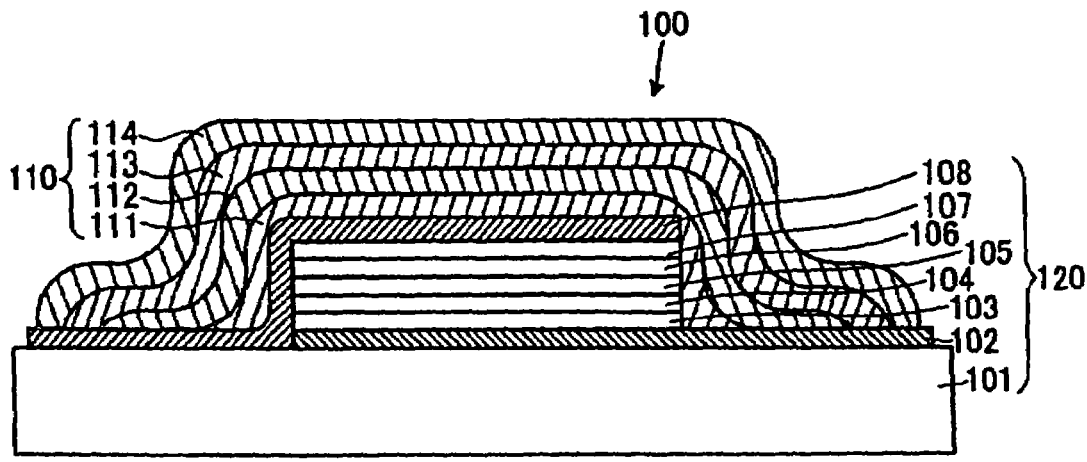
FIG. 1 is a schematic cross section showing a structure of an organic EL element in a first preferred embodiment in accordance with the present invention.

Hereafter, preferred embodiments of an organic EL element and an organic EL display panel in accordance with the present invention will be described in detail.

First Preferred Embodiment

The organic EL element in accordance with a first preferred embodiment of the present invention is an organic EL element having an element substrate for forming an organic layer including at least a light emitting layer between a pair of opposing electrodes which are provided on the substrate, in which a surface of the above-mentioned element substrate is covered with a sealing layer, wherein the sealing layer includes a layer which causes volume change in a predetermined environment.

Here, by the layer which causes volume change in the present embodiment we mean in particular a layer formed of a material showing plasticity under a predetermined environment. In the layer, if a certain portion is locally placed under the predetermined environment, the material which constitutes this portion causes plasticity locally, and changes in shape. As such a shape changes, the layer causes volume change.

For example, the organic EL element of the present preferred embodiment is provided with an element substrate arranged such that a lower electrode, an organic layer including at least a light emitting layer, and an upper electrode are formed on a substrate, and a surface of this element substrate is covered and sealed with a sealing layer. The thickness of the sealing layer is thin so that a thin film (that is, a sealing film) is formed. And this sealing layer is provided with a layer which causes volume change in a predetermined environment, specifically an environment in contact with degradation factors, such as water, oxygen, and an organic component.

For example, if a degradation factor ingresses through a defective part formed in the sealing layer, and contacts the layer which causes volume change, this layer's part in contact with the degradation factor causes volume change, and covers the defective part. In other words, this layer has a function to recover the defective part in the environment in contact with the degradation factor ingressed through the defective part. Hereafter, the layer having such a function is referred to as a self-recovery layer.

According to the organic EL element of the present preferred embodiment provided with this self-recovery layer, even if a defect, such as a pinhole, arises in the sealing layer, upon contact with the degradation factor ingressed through this defective part, the self-recovery layer changes in shape and buries a space of the defective part so that the defective part is recovered by itself, thus preventing the degradation factor from ingressing into the element through the defective part. Therefore, it is possible to prevent a dark spot from generating, expanding, etc. and realize a good element property and high productivity.

Moreover, the sealing layer of the organic EL element of the present preferred embodiment is further provided with a barrier layer formed of a material having barrier properties and a buffer layer constituted by a material which has buffer properties other than the self-recovery layer. Here, by the material which has barrier properties we mean a material of low permeability to degradation factors, such as water, oxygen, and an organic component, or a material stable to these degradation factors. Further, by the material which has buffer properties we mean a material which raises adhesion between layers or a material which is provided between layers so as to realize a good layer status.

The self-recovery layer is provided outside the buffer layer relative to the element substrate of the organic EL element, and provided inside the barrier layer. For example, the sealing layer is arranged on the element substrate, such that the buffer layer, the self-recovery layer, and the barrier layer are stacked in this order from the element substrate side.

Since the self-recovery layer is thus provided inside the barrier layer, the barrier layer can protect the self-recovery layer when defects, such as a pinhole, do not arise, from an external environment where degradation factors, such as water, oxygen, and an organic component, exist. Therefore, except when a defective part occurs in the sealing layer and a degradation factor ingresses into it through the defective part as described above, the self-recovery layer does not cause volume change and a solid state is held. Preferably such a barrier layer is provided at least in the outermost layer of the sealing layer, to thereby exhibit a protection effect more effectively.

Further, when the self-recovery layer is provided outside the buffer layer, a structure in which the buffer layer is provided between the element substrate and the self-recovery layer is realized. For example, when the surface of the element substrate has an irregular shape, if the self-recovery layer or the barrier layer is directly provided on the element substrate without providing the buffer layer, it is likely that a defect is generated in the self-recovery layer or the barrier layer under the influence of the unevenness of the element substrate surface, and it is difficult to realize a precise structure for these layers.

On the other hand, if the buffer layer is provided between the element substrate and the self-recovery layer like the present preferred embodiment, the buffer layer buries the irregularities of the element substrate surface, thus it is possible to form the self-recovery layer on a flat and smooth surface. For this reason, in the self-recovery layer and the barrier layer formed on it, it is possible to prevent a defect from generating and realize a good condition. It is preferable to provide such a buffer layer at least on the surface of the element substrate. Thus, a good layer condition is realized in the sealing layer provided above the element substrate. Hereafter, a particular example of the present preferred embodiment will be described with reference to the accompanying drawings.

FIG. 1 is a schematic cross section showing a structure of the organic EL element in the first preferred embodiment in accordance with the present invention. As shown in FIG. 1, an organic EL element 100 is provided with an element substrate 120 which is a basic structure of the element, and a sealing film 110 which covers this element substrate 120. The element substrate 120 has a structure in which at least a lower electrode 102 which is an anode, an electron hole injection layer 103, an electron hole transporting layer 104, a light emitting layer 105, an electron transporting layer 106, an electron injection layer 107, and at least an upper electrode 108 that is a cathode are stacked in order on a substrate 101. Further, the sealing film 110 has a structure in which a buffer layer 111, an inner barrier layer 112, a self-recovery layer 113, and an outer barrier layer 114 are stacked in order.

The material which constitutes the substrate 101 is suitably chosen from materials, such as glass, quartz, a plastic, wood, and paper. In the substrate 101 made of a material other than glass, a protective film (not shown), such as SiO2, is formed on an inner surface of the substrate 101 in order to prevent degradation factors other than water, oxygen, and various gases of the organic EL element 100, from ingressing into the element.

Here, the substrate 101 made of glass is used. As for the glass, there are several types of glass, such as soda lime glass, borosilicate glass, low alkali glass, nonalkali glass, silica glass, etc. The greatest difference of these types of glass is in contained alkali components, i.e. differences in the contents of sodium or potassium, and silicon dioxide. The glass is properly and suitably used according to the application.

For example, the substrate 101 of a alkali glass is inexpensive which includes soda lime glass (an alkali component content of 13%) with a high content of alkali component, borosilicate glass (an alkali component content of 13%), low alkali glass (an alkali component content of 7%), etc., however, the contained sodium, potassium, etc. may bleed and cause degradation etc. of the organic EL element 100. For this reason, it is necessary to cover the surface of the substrate 101 with SiO2.

On the other hand, although nonalkali glass (an alkali component content of 0%) and silica glass (an alkali component content of 0%) which have a low content of an alkali component are expensive, they have an advantage that sodium, potassium, etc. do not bleed. Therefore, these are used as a substrate of the active drive type organic EL element 100 using a TFT (thin film transistor). Further, since the substrate 101 of such, as mentioned, as a alkali glass has a rough surface, it is necessary to perform a surface treatment. A polish process is required especially for the substrate 101 of alkali glass as the surface treatment.

Further, as requirements for a component material of the substrate 101, the substrate 101 needs to be of transparency in the bottom emission type organic EL element 100 which emits light from the substrate 101 side. On the other hand, in the top emission type organic EL element 100 which emits light from the sealing film 110 side, the substrate 101 may not be transparent. In this case, it has a structure in which a reflective film is formed in the back of the substrate 101, so as to reflect light.

Preferably the lower electrode 102 which functions as an anode is made of a material of a high work function, i.e., a material which is easy to draw out an electron. For example, it is constituted by electrically conductive films, such as metal films made of Cr, Mo, Ni, Pt, Au, etc., and metal oxide films, for example ITO, IZO, etc. Further, as structural requirements for the lower electrode 102, the lower electrode 102 needs to be of transparency in the bottom emission type organic EL element 100 which emits light from the substrate 101 side.

Further, although not shown here, in the organic EL element 100, the wiring extended from the lower electrode 102 to the outside of the element, i.e., a lead electrode, is provided. The lead electrode is an electrode for connecting the organic EL display panel to external circuits, such as an integrated circuit for a panel drive, and a driver, in the organic EL display panel, as will be described later, constituted by the organic EL element 100. Preferably such a lead electrode is constituted by a low resistance metal material.

For example, it is constituted by an electrically conductive film made of a metal, such as Ag, Cr, Al, etc., its alloy, or ITO, or IZO which are metal oxides.

At the time of formation of the lower electrode 102 and the lead electrode (not shown), first, the electrically conductive film as mentioned above is formed in the whole inside of the substrate 101 by way of deposition, sputtering, etc. After that, this electrically conductive film is patterned into a predetermined shape, by way of photo lithography etc. so as to form the lower electrode 102 and the lead electrode (not shown). Here, the lower electrode 102 and the lead electrode (not shown) may be constituted by the electrically conductive film having a single layer, or may have a multilayer structure where a plurality of electrically conductive films which are different in type.

For example, it may be a two-layer structure where a metal oxide film, such as ITO and IZO, is stacked with a film made of a low resistance metal, such as Ag, Ag alloy, Al, Cr, etc. Moreover, it may be a three-layer structure where a film made of a high oxidation-resistance material, such as Cu, Cr, Ta, etc., as a protective layer for the metal film, such as Ag is further stacked. After forming and stacking a film which constitutes such a multilayer structure one by one, the patterning is carried out.

On the lower electrode 102, the electron hole injection layer 103 which is an organic layer, the electron hole transporting layer 104, the light emitting layer 105, the electron transporting layer 106, and the electron injection layer 107 are stacked one by one. Each of the layers 103-107 is constituted by an organic material of a high polymer or a low molecule which is used in the conventional organic EL element. Hereafter, the details of each of the layers 103-107 will be described.

First, the electron hole injection layer 103 is provided in order to make electron hole injection from the lower electrode 102 easy and prompt. Therefore, it is preferably made of a material which is very close to a HOMO level of the lower electrode 102. In particular, the material which constitutes the electron hole injection layer 103 is constituted by a material with small ionization potential. Further, the electron hole transporting layer 104 is provided in order to transport the electron hole injected into the electron hole injection layer 103, to the light emitting layer 105 promptly. Therefore, it is preferably made of a material which has a high transporting performance of the electron hole.

The component material for the electron hole injection layer 103 and the electron hole transporting layer 104 can be arbitrarily chosen from conventionally known compounds. As particular examples, organic materials are used, which are porphirin compounds, such as copper phthalocyanine (Cu—Pc) etc., starburst type amines, such as m-MTDATA etc., mulitimers of benzidine type amine, aromatic tertiary amines, such as 4,4'-bis [N-(1-naphthyl)-N-phenyl amino]-biphenyl (NPB), N-phenyl-p-phenylenediamine (PPD), etc., stilbene compounds, such as 4-(di-P-tolylamino)-4'-[4-(di-P-tolylamino) styryl] still benzene etc., triazol derivatives, styrylamine compounds, and fullerenes, such as buckyball, C60 etc. Further, a polymer dispersion type material may be used in which a low molecule material is dispersed into a high polymer material, such as polycarbonate etc.

Light emission in the light emitting layer 105 may be light emission (fluorescence) at the time of returning from a singlet excitation state to a ground state. Alternatively, it may be light emission (phosphorescence) at the time of returning from a triplet excitation state to the ground state. According to the mechanism of the light emission, the component material of the light emitting layer 105 is selected suitably. It is possible to use a well-known luminescent material as the component material of the light emitting layer 105.

Particular luminescent materials to be used are aromatic dimethylidine compounds, such as 4,4'-bis (2,2'-diphenyl vinyl)-biphenyl (DPVBi) etc., styryl benzene compounds, such as 1,4-bis (2-methylstyryl) benzene etc., triazol derivatives, such as 3-(4-biphenyl)-4-phenyl-5-t-butylphenyl-1,2, 4-triazol (TAZ) etc., fluorescence organic materials, such as anthraquinone derivatives, fuluorenone derivatives, etc., fluorescent organic metallic compounds, such as aluminum (8-hydroxy quinolinate) complex (Alq3) etc., polymer materials, such as the polyparaphynylene vinylenes (PPV), polyfuluorenes, and polyvinyl carbazoles (PVK), etc. Further, an organic material which can employ phosphorescence from a triplet exciton for luminescence can be used, for example, organic materials, such as a platinum complex, an iridium complex, etc.

Further, for example, the light emitting layer 105 may be made of only the above-mentioned luminescent material, or may contain the component material of the above-mentioned electron hole transporting layer 104, the component material of the electron transporting layer 106 as will be described later, additives, such as a donor and an acceptor, a luminescent dopant, etc. When it contains any of these, these are dispersed into the material which constitutes the light emitting layer 105.

The electron transporting layer 106 is provided in order to promptly transport the electron injected into the electron injection layer 107 to the light emitting layer 105. Therefore, it is preferably made of a material having a high electron transporting performance. Further, the electron injection layer 107 is arranged so that the electron injection may be performed through the upper electrode 108 easily and promptly. Therefore, it is preferably made of a material which is very close to a LUMO level of the upper electrode 108 and has a large electron affinity.

Any material can suitably be selected from conventional and well-known compounds and used as the component material for the electron injection layer 107 and the electron transporting layer 106. In particular, it is possible to use organic materials, such as a silacyclo pentadiene (silole) derivative (such as PyPySPyPy etc.), a nitro-substituted fuluorenone derivative, and an anthraquinodimethane derivative, a metal complex of 8-quinolinole derivatives, such as tris (8-hydroxy quinolinate) aluminum ($Alq_3$), triazol compounds, such as a metal phthalocyanine, 3-(4-biphenyl)-5-(4-t-butylphenyl)-4-phenyl-1,2,4-triazol (TAZ), etc., oxadiazol compounds, such as 2-(4-biphenylyl)-5-(4-t-butyl)-1, 3,4-oxadiazol (PBD) etc., metal oxides, such as LiO2 etc., fullerenes, such as buckyball, C60, a carbon nanotube, etc.

At the time of formation of the electron hole injection layer 103, the electron hole transporting layer 104, the light emitting layer 105, the electron transporting layer 106, and the electron injection layer 107, it is possible to use conventional film forming processes, for example, applying processes, such as a spin coating process, a dipping process, etc., wet processes, such as printing processes including a screen printing process, and an ink-jet process, dry processes, such as a laser transfer process, and a vacuum depositing process etc. Any of these processes may be combined to form film.

For heating the film forming material in the vacuum depositing method, resistance heating, induction heating, dielectric heating, electron beam heating, laser heating, etc. may be employed.

Preferably the upper electrode 108 which constitutes the cathode is made of a material of a low work function, i.e., a material with which an electron is easy to jump out. For example, it is constituted by a metal film made of a metal, such as an alkali metal (Li, Na, K, Rb, or Cs), an alkali-earth metal (Be, Mg, Ca, Sr, or Ba), a rare earth metal, etc. or a compound of any of them, or an alloy containing any of them.

Here, when the organic EL element 100 is the top emission type in which light is emitted from the upper electrode 108 side, the upper electrode 108 needs to be of transparency. On the other hand, the upper electrode 108 does not need to be of transparency, when it is the bottom emission type which emits light from the substrate 101 side. In this case, for example, the upper electrode 108 functions as a reflective film, or alternatively a reflective film is formed separately.

Further, although not shown here, a lead electrode which is lead wiring from the upper electrode 108 to the outside of the element is provided for the upper electrode 108 as in the lower electrode 102. The material and structure of the lead electrode (not shown), are the same as those of the lead electrode (not shown) of the lower electrode 102. Further, the structure and the formation method of the lead electrode (not shown) and the upper electrode 108 are as described above with reference to the lower electrode 102.

Then, the sealing film 110 will be described which is a characteristic structure of the organic EL element 100 of the present preferred embodiment. The sealing film 110 is provided with the buffer layer 111, the inner barrier layer 112, the self-recovery layer 113, and the outer barrier layer 114. In the organic EL element 100, the sealing film 110 having such a structure covers and seals the whole surface of the element substrate 120 in particular an upper surface and side faces of the element substrate 120.

In addition, the structure of the sealing film 110 may not be limited to the structure of the present preferred embodiment, and may be another structure. For example, in the sealing film 110 of the present preferred embodiment, although one of each of the buffer layer 111 and the inner barrier layer 112 is provided closer to the element substrate 120 side, than the self-recovery layer 113, alternatively a pair of the buffer layer 111 and the inner barrier layer 112 may be provided and also predetermined pairs of them may be stacked.

In this case, the buffer layers 111 and the inner barrier layers 112 are stacked alternately into a plurality of layers on which the self-recovery layer 113 and the outer barrier layer 114 are further stacked one by one. With this structure, the barrier layer located in the outermost layer is equivalent to the outer barrier layer 114, and the barrier layer located closer to the element substrate 120 than the self-recovery layer 113 is equivalent to the inner barrier layer 112.

Further, for example, the outer barrier layer 114 may have a multilayer structure, or the buffer layer 111 may be further provided between the self-recovery layer 113 and the outer barrier layer 114. Furthermore, the inner barrier layer 112 may be omitted from the structure. In addition, although the buffer layer 111 and the outer barrier layer 114 may be omitted from the structure, it is preferable to provide the buffer layer 111 in view of a relationship between the element substrate 120 and the sealing film 110, and it is preferable to provide the outer barrier layer 114 in terms of protecting the organic EL element 100 as a whole and maintaining the solid state of the self-recovery layer 113 where no degradation factors exist.

Here, the buffer layer 111 is provided in order to bury and smooth the unevenness of the surface of the layer (here, equivalent to the element substrate 120) located in the lower part. By forming the buffer layer 111, the layers (here, equivalent to the inner barrier layer 112, the self-recovery layer 113, and the outer barrier layer 114) located in the upper part of the buffer layer 111 become precise layers with reduced defects. The materials to be used which constitute the buffer layer 111 are a photo-curing resin, a thermosetting resin, etc., for example. In particular, they may be an epoxy resin, an acrylic resin, polyparaxylene, fluoropolymers, such as perfluoro olefins, perfluoro ethers, etc., metal alkoxide, such as $CH_3OM$, $C_2H_5OM$, etc., a polyimide precursor, perylene compounds, and metal films, such as Ca etc.

Further, the inner barrier layer 112 and the outer barrier layer 114 are provided in order to protect the element substrate 120, and in particular the outer barrier layer 114 is provided to protect the element substrate 120 and the self-recovery layer 113, from the external environment. For example, the outer barrier layer 114 is constituted by a material having low moisture permeability and being stable to moisture, or a material having low oxygen permeability and being stable to oxygen. The outer barrier layer 114 as mentioned above can protect the element substrate 120 from water or oxygen which exists under the external environment.

Figure 2:
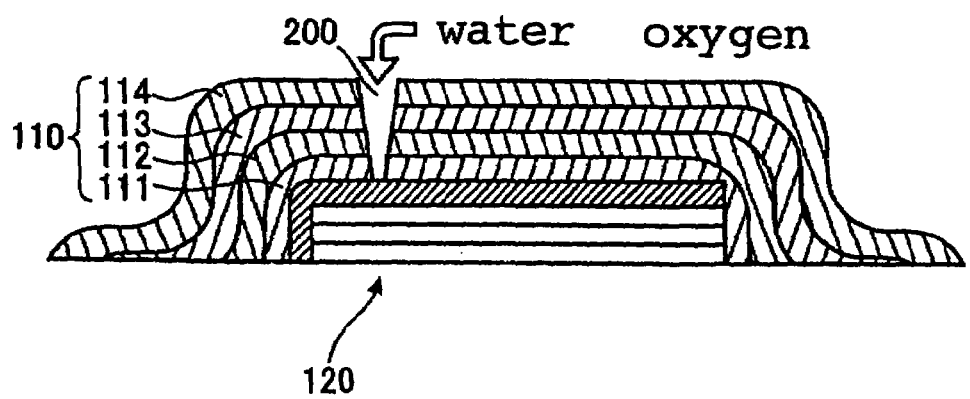
FIG. 2 is a partially schematic section for explaining a self-recovery operation of a self-recovery layer in a sealing film of the organic EL element of FIG. 1.

Further, as will be described later, the self-recovery layer 113 causes volume change in the environment in contact with water, oxygen, etc. With the structure, the self-recovery layer 113 is protected from the external environment by the outer barrier layer 114, i.e. it is arranged to block water, oxygen, etc. which exist under the external environment. Thus, as shown in FIG. 2 which will be explained later, except when a pinhole 200 is formed in the sealing film 110 and water, oxygen, etc. ingress, the self-recovery layer 113 does not cause volume change, so that the solid condition is maintained.

In particular, as examples of the material which constitutes the inner barrier layer 112 and the outer barrier layer 114, there may be mentioned nitrides, such as SiN, AlN, GaN, etc., oxides, such as $SiO_2$, $Al_2O_3$, $Ta_2O_5$, ZnO, GeO, etc., oxide-nitrides, such as SiON etc., carbide-nitrides, such as SiCN etc., a metal fluorine compound, a metal film, etc. Examples of materials constituting the buffer layer 111, the inner barrier layer 112, and the outer barrier layer 114 as mentioned above, and the provision numbers are selected and set up suitably.

On the other hand, the self-recovery layer 113 is made of a material which exhibits a self-recovery function in contact with degradation factors, such as water (here, including a liquid state and a gas state), oxygen, various gases, an organic component, etc. Here, by the self-recovery function of the self-recovery layer 113 we mean when the degradation factors as mentioned above contact the defective part (in particular, a missing part, such as a pinhole etc. to be described later) produced in the self-recovery layer 113, so that the self-recovery layer 113 around the defective part may cause volume change and flow into the defective part so as to bury the defective part, whereby the defective part is restored.

As examples of particular component material of the self-recovery layer 113, materials that cause volume change in contact with the degradation factor ingressing from the outside are used, which are a material causing volume change due to water, a material causing volume change due to oxygen, a material causing volume change due to gas, other than oxygen, which exists under the external environment of the organic EL element 100. The self-recovery layer 113 may be constituted by any one of the materials as mentioned above, and may be constituted by two or more types of the materials. For example, the material causing volume change in contact with water and the material causing volume change in contact with oxygen may be mixed to arrange the self-recovery layer 113.

For example, the self-recovery layer 113 may be constituted by the material which shows plasticity due to water or oxygen. In the self-recovery layer 113 which is constituted by these material, the component material shows plasticity in contact with water or oxygen, and causes the volume to change. As this volume changes, the shape of the self-recovery layer 113 changes. As examples of the available material which constitutes the self-recovery layer 113, there may be mentioned a mixed resin of polyethylene by using a metallocene catalyst and a thermoplastic resin, or an oxygen absorbing resin blended with an iron-containing oxygen absorbent constituted by mixing iron powder and a halogenation metal with a polyolefin resin which is a thermoplastic resin.

Further, an oxygen absorbing resin may be used, containing a polyamide resin and transition metal catalysts which are halides, such as a chloride, and an inorganic acid salt of an oxyacid salt of sulfur, such as a sulfate. It is possible to use super water-absorbent polymers, such as acrylate polymer cross-linked material, cross-linked material of poly vinyl alcohol—acrylate copolymer, etc., a mixture of a water absorbing resin, such as vinyl alcohol, and an oxygen absorbing resin mixed with an olefin resin, an oxygen absorbing polyamide resin composition, etc.

Although the thickness of each of the layers 111-114 which constitute the sealing film 110 is not particularly limited and is set up suitably, the self-recovery layer 113 should have the thickness which can realize a self-recovery operation as will be described later.

Figure 3:
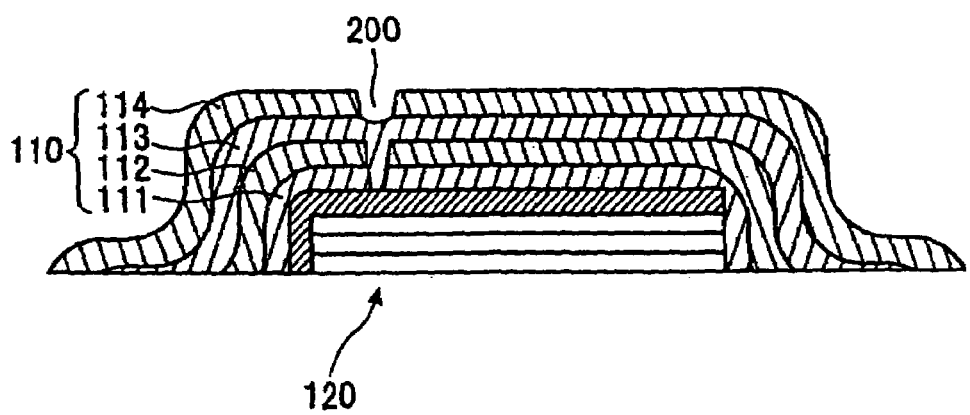
FIG. 3 is another partially schematic section for explaining the self-recovery operation of the self-recovery layer in the sealing film of the organic EL element of FIG. 1.

Next, with reference to FIGS. 2 and 3, the self-recovery operation of the self-recovery layer 113 in the sealing film 110 will be particularly described together with a film forming process of the sealing film 110. FIGS. 2 and 3 are partially schematic sections of the organic EL element 100 for explaining the self-recovery operation of the self-recovery layer 113. In addition, the element substrate 120 as shown in FIG. 1 is not particularly illustrated in FIGS. 2 and 3, First, in the film forming process of the sealing film 110, as shown in FIG. 1, the buffer layer 111 is formed so that the whole surface of the element substrate 120 may be covered. Here, the photo-curing resin is applied to the whole surface of the element substrate 120 by way of the spin coating process etc. After that, this resin is irradiated with ultraviolet rays and cured, so that the buffer layer 111 is formed.

Then, the inner barrier layer 112 is formed so that the whole surface of this buffer layer 111 may be covered. Here, the inner barrier layer 112 having a $SiN_x$ film is formed by way of the sputtering process using a target made of $Si_3N_4$. Furthermore, the self-recovery layer 113 is formed so as to cover the whole surface of the thus formed inner barrier layer 112.

Here, a mixture of a water absorbing resin, such as poly vinyl alcohol, and an oxygen absorbing resin mixed with an olefin resin is used as the component material of the self-recovery layer 113. The mixture resin is applied to the whole surface of the inner barrier layer 112 by way of the spin coating process. After that, the resin is cured by heating and the self-recovery layer 113 is formed.

Finally, the outer barrier layer 114 is formed so that the whole surface of the thus formed self-recovery layer 113 may be covered. Here, similar to the case of the inner barrier layer 112, the outer barrier layer 114 made a SiNx film is formed by way of the sputtering process using the target made of Si3N4. As described above, the sealing film 110 provided with the buffer layer 111, the inner barrier layer 112, the self-recovery layer 113, and the outer barrier layer 114 is formed.

By the way, when the inner barrier layer 112 and the outer barrier layer 114 are formed by way of the sputtering process, a target is hit by the plasma generated in vacuum to cause a target particle to jump out. By adhering and depositing the jumped target particles to/on the film forming side, a film is formed. With this method, impurities, such as particles, as well as target particles may adhere to or accumulate on the film forming side, so that impurities, such as particles, may adhere to or be mixed in the films which constitutes the inner barrier layer 112 and the outer barrier layer 114.

If the impurities which are adhered to or mixed in the inner barrier layer 112 and the outer barrier layer 114 as described above are separated from these layers 112, 114, part of the buffer layer 111, the inner barrier layer 112, the self-recovery layer 113, and the outer barrier layer 114 which constitute the sealing film 110 is locally separated together with impurities. Thus, as shown in FIG. 2, the pinhole 200 is formed penetrating into each of the layers 111-114 which constitute the sealing film 110.

Because of the formation of this pinhole 200, an area of the buffer layer 111, the inner barrier layer 112, the self-recovery layer 113, and the outer barrier layer 114 which define the inner wall of the pinhole 200, is exposed to the external environment, and the element substrate 120 is also exposed to the external environment through the pinhole 200. Through the pinhole 200, the degradation factors, such as water, oxygen, etc., which exist outside the organic EL element 100, (that is, they exist under the external environment) tend to ingress into the element substrate 120 side.

Here, in the organic EL element 100 of the present preferred embodiment, if the pinhole 200 is formed as shown in FIG. 3, the deposition in an area of the self-recovery layer 113 changes locally, which is in contact with the water and oxygen ingressed into the sealing film 110 through the pinhole 200. In particular, firstly the water absorbing resin which constitutes the self-recovery layer 113 absorbs the water ingressed into the pinhole 200, and the oxygen absorbing resin which constitutes the self-recovery layer 113 absorbs the oxygen ingressed into the pinhole 200.

Then, in the self-recovery layer 113, the deposition of the water absorbing resin absorbed the water and the oxygen absorbing resin absorbed oxygen locally changes around the pinhole 200, and fills the inside of the pinhole 200. Thus, the pinhole 200 is closed by the self-recovery layer 113 and the self-recovery is achieved. Therefore, this self-recovery can prevent the element substrate 120 from being exposed to the external environment, thus it is possible to prevent oxygen or water from ingressing into the element substrate 120 of the organic EL element 100.

In the organic EL element 100 having the above-mentioned structure, the electron hole injected from the lower electrode 102 into the electron hole injection layer 103 is introduced into the light emitting layer 105 through the electron hole transporting layer 104. On the other hand, the electron injected from the upper electrode 108 into the electron injection layer 107 is introduced into the light emitting layer 105 through the electron transporting layer 106. Then, the electron hole and electron introduced into the light emitting layer 105 join together, to thereby cause light emission in the light emitting layer 105.

Here, in the organic EL element 100, as described above, since the self-recovery layer 113 of the sealing film 110 prevents the degradation factor from ingressing into the inside of the element, the degradation resulting from this degradation factor is controlled in the electron hole injection layer 103, the electron hole transporting layer 104, the light emitting layer 105, the electron transporting layer 106, and the electron injection layer 107, which constitute the organic EL element 100. Therefore, in the organic EL element 100, it is possible to prevent the generation or the expansion of the dark spot, and other element degradations resulting from the degradation factor.

As described above, according to the organic EL element 100 of the present preferred embodiment, even if the pinhole 200 is formed in the sealing film 110, the self-recovery of the pinhole 200 is locally carried out by the self-recovery layer 113, so that the degradation factors, such as water and oxygen, is prevented from ingressing into the inside of the element through the pinhole 200, and the sufficient sealing can stably be carried out. Therefore, the degradation of the element property of the organic EL element 100 caused by the degradation factors, such as water and oxygen, is prevented. As a result it is possible to realize a good element property, in particular a good light emission property etc.

Further, since the self-recovery layer 113 is formed in the sealing film 110, even if the thickness of sealing film 110 is not increased, it is possible to prevent the ingress of the degradation factor. Therefore, an advantageous effect is provided in terms of thinning the organic EL element 100, or manufacturing efficiency, and also the problem caused by increasing in the thickness of the sealing film 110 is solved.

Second Preferred Embodiment

The organic EL display panel in accordance with a second preferred embodiment of the present invention is constituted by the organic EL element of the first preferred embodiment. In the organic EL display panel of the present preferred embodiment having this structure, in the organic EL element which is a component of the panel, the dark spot as described above is prevented from generating, expanding, etc., and a good element property is realized. Therefore, in the organic EL display panel constituted by such an organic EL element, it is possible to realize a high quality panel having a good display property. Hereafter, with reference to FIG. 4, an example of the organic EL display panel in accordance with the second preferred embodiment of the present invention will be described.

Figure 4:
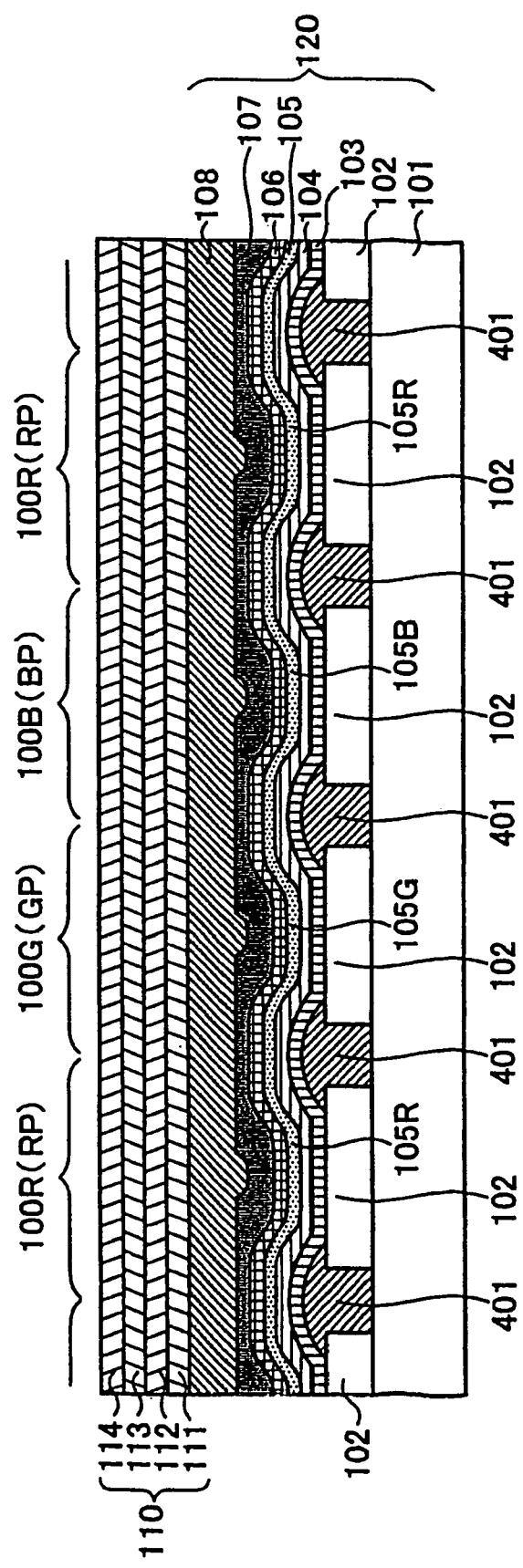
FIG. 4 is a schematic section showing a structure of an organic EL display panel in a second preferred embodiment in accordance with the present invention.

FIG. 4 is a schematic cross section showing a structure of the organic EL display panel in the second preferred embodiment of the present invention. Here, the organic EL display panel of a passive drive type full color display will be described. This organic EL display panel may be a top emission type, alternatively may be a bottom emission type.

As shown in FIG. 4, the organic EL display panel of the present preferred embodiment is constituted by a plurality of organic EL elements 100R, 100G, and 100B which have a similar structure to that of the organic EL element 100 of the first preferred embodiment as shown in FIG. 1. The organic EL element 100R is provided with a light emitting layer 105R for performing red light emission, and carries out the red light emission. Further, the organic EL element 100G is provided with a light emitting layer 105G for performing green light emission, and carries out the green light emission. Furthermore, the organic EL element 100B is provided with a light emitting layer 105B for performing blue light emission, and carries out blue light emission.

In the organic EL display panel, a red pixel, a green pixel, and a blue pixel are formed by the organic EL elements 100R, 100G, and 100B of the respective light emission colors, and full color display is realized by way of RGB display.

Hereafter, a detailed structure of the organic EL display panel of the present preferred embodiment will be described together with a manufacturing process. Firstly, the manufacturing process of the organic EL display panel is divided roughly into a pretreatment process of forming the lower electrode 102, a film forming process of forming the electron hole injection layer 103, the electron hole transporting layer 104, the light emitting layer 105 (105R, 105G, 105B), the electron transporting layer 106, the electron injection layer 107, and the upper electrode 108, so as to form the element substrate 120, and a sealing process of sealing this element substrate 120 by the sealing film 110.

At the time of manufacture of the organic EL display panel, in the pretreatment process, a plurality of lower electrodes 102 are first formed in the shape of a stripe at the predetermined intervals on the substrate 101 by way of the above-mentioned method in the first preferred embodiment. Then, by way of the method as described above in the first preferred embodiment, the lead electrodes (not shown) is formed, extending from this lower electrodes 102 and connected to an integrated circuit, a driver, etc. outside the panel.

When the lower electrodes 102 and the lead electrodes (not shown) are formed on the substrate 101, an insulation film 401 is formed on an exposed surface of the substrate 101 through the lower electrodes 102. Further, although not illustrated, a partition is formed on this insulation film 401. Here, the insulation film 401 made of polyimide, SiO2, etc. is formed so as to surround the light emission area (i.e. except for this light emission area) formed such that the upper electrode 108 and the lower electrode 102 are crossed. By way of the above-mentioned pretreatment, a pretreatment substrate in which the lower electrodes 102, the lead electrodes (not shown), the insulation film 401, and the partition (not shown) are formed on the substrate 101.

Then, the thus obtained pretreatment substrate is subjected to each processing of the film forming process, and the electron hole injection layer 103, the electron hole transporting layer 104, the light emitting layer 105, the electron transporting layer 106, and the electron injection layer 107 are formed one by one. The film forming method when forming each of the layers 103-107 is as described above in the first preferred embodiment.

In other words, the electron hole injection layer 103 is first formed on the surface of the pretreatment substrate obtained by way of the pretreatment process, and the electron hole transporting layer 104 is further formed on this electron hole injection layer 103. Then, the light emitting layer 105 is further formed on this electron hole injection layer 104. Here, at the time of formation of the light emitting layer 105, the light emitting layer 105 of the organic EL elements 100R, 100G, and 100B is subjected to separate application so as to form the red light emitting layer 105R, the green light emitting layer 105G, and the blue light emitting layer 105B.

Such separate application to the light emitting layer 105 allows formation of pixels of three different type of colors.

In other words, a green pixel GP constituted by the organic EL element 100G which carries out green light emission, a red pixel RP constituted by the organic EL element 100R which carries out red light emission, and a blue pixel BP constituted by the organic EL element 100B which carries out blue light emission, are formed adjacently.

The red light emitting layer 105R, the green light emitting layer 105G, and the blue light emitting layer 105B of the organic EL elements 100R, 100G, and 100B are easily realized by way of film formation using three types of film forming masks (not shown) which have different aperture patterns. For example, when the red light emitting layer 105R is selectively formed in the area of the organic EL element 100R, a film is formed only on this area by using the mask for film forming (not shown) which has an aperture. In the area of the organic EL element 100R, through the aperture of the mask for film forming (not shown), a red luminescent material is deposited on the electron hole transporting layer 104, whereby the red light emitting layer 105R is formed.

At this stage, since the areas of organic EL elements 100G and 100B are covered with the mask for film forming (not shown), the red luminescent material accumulates on the surface of the mask for film forming (not shown) in these areas. Thus, it is possible to form the red light emitting layer 105R only in the area of the organic EL element 100R selectively.

As described above, when forming the green light emitting layer 105G in the area of the organic EL element 100G, the mask for film forming (not shown) which has an aperture only in this area is used. When forming the blue light emitting layer 105B in the area of the organic EL element 100B, the mask for film forming (not shown) which has an aperture only in this area is used. Further, when each forming the red light emitting layer 105R, the green light emitting layer 105G, and the blue light emitting layer 105B using such a mask for film forming (not shown), a film is formed repeatedly twice or more, for example, to thereby prevent an immature film in the red light emitting layer 105R, the green light emitting layer 105G, and the blue light emitting layer 105B of the organic EL elements 100R, 100G, and 100B.

Being subjected to the separate application, the light emitting layer 105 constituted by the red light emitting layer 105R, the green light emitting layer 105G, and the blue light emitting layer 105B is formed, then the electron transporting layer 106 is formed on the surface of the light emitting layer 105. Next, the electron injection layer 107 is further formed on this electron transporting layer 106. Subsequently, the upper electrode 108 is formed on the surface of the electron injection layer 107 by way of the method as described in the first preferred embodiment.

Here, a plurality of stripe-shaped upper electrodes 108 which intersect perpendicularly with the lower electrodes 102 are formed at the predetermined intervals by means of a partition pattern. Thus, the area of the light emitting layer 105 located in the intersection between the lower electrodes 102 and the upper electrodes 108 is allowed to emit light. In the present preferred embodiment, the organic EL display panel passively driven is realized, in which a plurality of pixels RP, GP, and BP constituted by the organic EL elements 100R, 100G, and 100B are arranged in the shape of a matrix.

After the upper electrode 108 is formed, the lead electrode (not shown) is formed, extending from the upper electrode 108 and connected to an integrated circuit, a driver, etc. of the outside of the panel, similar to the case of the lower electrode 102. A method of forming the lead electrode (not shown) is as described above in the first preferred embodiment.

As described above, in the film forming process, the element substrate 120 is obtained, in which the electron hole injection layer 103, the electron hole transporting layer 104, the light emitting layer 105 (105R, 105G, 105B), the electron transporting layer 106, the electron injection layer 107, the upper electrode 108, and the lead electrode (not shown) are formed on the pretreatment substrate obtained in the pretreatment process. Then, each processing is further performed in the sealing process, and the sealing film 110 is formed at the element substrate 120.

Particularly, in the sealing process, firstly, in an inert gas atmosphere, such as nitrogen gas, argon gas, etc., the buffer layer 111 which covers the surface of the element substrate 120 is formed by way of the method as described above in the first preferred embodiment. Further, the inner barrier layer 112, the self-recovery layer 113, and the outer barrier layer 114 are further formed one by one. Thus, each of the layers 111-114 is formed on the element substrate 120 one by one, to form the sealing film 110, whereby the element substrate 120 is sealed by the sealing film 110.

Here, the pinhole 200 is formed in the sealing film 110 due to the separation etc. of the impurities, such as a foreign substance etc., adhered at the time of film forming in the thus formed sealing film 110 as described above referring to FIG. 2 of the first preferred embodiment, so that the sealing film 110 is constituted including the self-recovery layer 113, the pinhole 200 is closed by the self-recovery layer 113 and the self-recovery is carried out as described above referring to FIG. 3 of the first preferred embodiment. Therefore, it is possible to prevent the degradation factors, such as water and oxygen, from ingressing into the element substrate 120 through the pinhole 200.

The element substrate 120 sealed by the sealing film 110 as described above is further subjected to various processes, such as a scribe process, lighting inspection, a TAB crimp process, a circular polarization plate adhesion process, module inspection, etc., so that the organic EL display panel is produced through such various processes in the sealing process.

As described above, in the organic EL display panel of the present preferred embodiment, since the self-recovery of the defective part, such as the pinhole 200 formed in the sealing film 110 is carried out by the self-recovery layer 113 of the sealing film 110, it is possible to prevent the degradation factor from ingressing into the inside of the element from the outside through the defective part of the sealing film 110. Therefore, in each of the organic EL elements 100R, 100G, and 100B, the degradation of the element property due the generation, expansion, etc. of the dark spot is prevented, and a good element property is realized.

Therefore, in the organic EL display panel constituted by the organic EL elements 100R, 100G, and 100B as mentioned above, good display properties etc. can be realized in each of the pixels RP, GP, and BP, thus it is possible to stably provide a high quality and a high throughput. Further, it is thinned compared with the conventional organic EL display panel arranged to be sealed using the sealing can or the sealing substrate. Furthermore, the self-recovery layer 113 as described above can be easily formed in a series of film forming processes together with the buffer layer 111, or the inner and outer barrier layers 112, 114 of the sealing film 110, and does not need a special process or equipment.

In addition, although the organic EL display panel in which the light emitting layer 105 of each of the organic EL elements 100R, 100G, and 100B which constitute each of the pixels RP, GP, and BP is subjected to the separate application so as to realize the full color display is described in the above, it may be an organic EL display panel a color filter type, in which the light emitting layer 105 of white monochrome light emission is provided, and red, green, and blue color filters are respectively provided for the pixels RP, GP, and BP, so as to realize the full color display.

Further, it may be an organic EL display panel which realizes the full color display by way of a color matching method combining the light emitting layer 105 of monochrome light emission, such as white, blue, etc., with a color conversion layer by means of a fluorescence material. Furthermore, it may be an organic EL display panel of a photo-bleaching method in which the light emission area of the monochromatic light emitting layer 105 is irradiated with an electromagnetic wave etc. so as to realize a plurality of light emission colors, and the SOLED (transparent Stached OLED) method in which a plurality of organic EL element which has the light emitting layer 105 having different light emission colors are stacked so as to form one pixel.

Further, although the organic EL display panel which is passively driven is described in the above, the present invention is applicable also to an active drive type organic EL display panel driven by a TFT. Further, although the organic EL display panel in accordance with the present invention may be of either the bottom emission type or the top emission type as described above, it is possible to reduce the influence of the refractive index of the sealing film 110 at the time of emitting light, especially compared with the case where the sealing is performed using the conventional sealing can and the conventional sealing substrate in the case of the top emission type, thus exhibiting more advantageous effects.

Further, the structure of the organic layer which constitutes the organic EL element 100 of the first preferred embodiment and the organic EL display panel of the second preferred embodiment is not limited to the structure provided with the electron hole injection layer 103, the electron hole transporting layer 104, the light emitting layer 105, the electron transporting layer 106, and the electron injection layer 107 as shown in FIGS. 1 and 4. For example, the light emitting layer 105, the electron hole transporting layer 104, and the electron transporting layer 106 may not be of a single layer structure but of a multilayer structure. Further, either the electron hole transporting layer 104 or the electron transporting layer 106 may be omitted, or both may be omitted. Furthermore, organic layers, such as a carrier blocking layer may be inserted according to an application.

Further, it may be arranged such that the lower electrode 102 is a cathode and the upper electrode 108 is an anode. In this case, the electron injection layer 103, the electron transporting layer 104, the light emitting layer 105, the electron hole transporting layer 106, and the electron hole injection layer 107 are formed in order from the substrate 101 side of FIG. 4.

Furthermore, in the organic EL element 100 of the first preferred embodiment, and the organic EL display panel of the second preferred embodiment, although the self-recovery layer 113 of the sealing film 110 is described which has one layer, it may be arranged to include a plurality of self-recovery layers 113. For example, it may be arranged to include a first self-recovery layer made of a material which causes volume change in contact with water, and a second self-recovery layer 113 made of a material which causes volume change in contact with oxygen. In this case, the first and second self-recovery layers 113 are stacked together, or alternatively the inner barrier layer 113 and the buffer layer 112 are further provided and interposed between the first and second self-recovery layers 113. Thus, the above-mentioned effect is provided also in the structure including a plurality of self-recovery layers 113 having different properties.

Furthermore, for example, the plurality of self-recovery layers 113 of the first preferred embodiment and the second preferred embodiment formed such that the material which causes volume change in contact with water and the material which causes volume change in contact with oxygen are mixed together, may be arranged to be stacked into multiple layers, through the inner barrier layer 113 or the buffer layer 112. Thus, when stacking the plurality of homogeneous self-recovery layers 113, the above-mentioned effect is also provided.

Furthermore, the organic EL element manufactured by the manufacturing method in accordance with the present invention can be used also for applications other than the display panel.

What is claimed is:

1. An organic EL element having an element substrate for forming an organic layer including at least a light emitting layer between a pair of opposing electrodes which are provided on the substrate, in which a surface of said element substrate is covered with a sealing layer, wherein said sealing layer includes a self-recovery layer which causes volume change in a predetermined environment.

2. The organic EL element as claimed in claim 1, wherein said self-recovery layer includes a material which causes volume change in contact with at least any one of water, oxygen, and an organic component.

3. The organic EL element as claimed in claim 1 or 2, wherein said sealing layer is further provided with a barrier layer, and said self-recovery layer is provided closer to said element substrate than said barrier layer.

4. The organic EL element as claimed in claim 3, wherein said barrier layer is provided in the outermost position of said sealing layer with respect to said element substrate.

5. The organic EL element as claimed in claim 1 or 2, wherein said sealing layer is further provided with a buffer layer, and said buffer layer is provided on the surface of said element substrate.

6. The organic EL element as claimed in claim 3, wherein said sealing layer is further provided with a buffer layer, and said buffer layer is provided on a surface of said element substrate.

7. The organic EL element as claimed in claim 4, wherein said sealing layer is further provided with a buffer layer, and said buffer layer is provided on a surface of said element substrate.

8. An organic EL display panel constituted by an organic EL element having an element substrate for forming an organic layer including at least a light emitting layer between a pair of opposing electrodes which are provided on the substrate, in which a surface of said element substrate is covered with a sealing layer, wherein said sealing layer of said organic EL element includes a self-recovery layer which causes volume change in a predetermined environment.

9. The organic EL display panel as claimed in claim 8, wherein said self-recovery layer includes a material which causes volume change in contact with at least any one of water, oxygen, and an organic component.

10. The organic EL display panel as claimed in claim 8 or 9, wherein said sealing layer is further provided with a barrier layer, and said self-recovery layer is provided closer to said element substrate than said barrier layer.

11. The organic EL display panel as claimed in claim 10, wherein said barrier layer is provided in the outermost position of said sealing layer with respect to said element substrate.

12. The organic EL display panel as claimed in claim 8 or 9, wherein said sealing layer is further provided with a buffer layer, and said buffer layer is provided on the surface of said element substrate.

13. The organic EL display panel as claimed in claim 10, wherein said sealing layer is further provided with a buffer layer, and said buffer layer is provided on a surface of said element substrate.

14. The organic EL display panel as claimed in claim 11, wherein said sealing layer is further provided with a buffer layer, and said buffer layer is provided on a surface of said element substrate.

* * * * *